United States Patent
Lee et al.

(10) Patent No.: US 10,871,514 B2
(45) Date of Patent: Dec. 22, 2020

(54) HIGH-VOLTAGE ISOLATOR TESTING

(71) Applicant: Texas Instruments Incorporated, Dallas, TX (US)

(72) Inventors: Chi-Tsung Lee, New Taipei (TW); Ming-Chuan You, New Taipei (TW); Chien-Lin Wu, New Taipei (TW); David Anthony Graham, Plano, TX (US); Andrew Patrick Couch, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 598 days.

(21) Appl. No.: 15/151,159

(22) Filed: May 10, 2016

(65) Prior Publication Data

US 2017/0328947 A1 Nov. 16, 2017

(51) Int. Cl.
*G01R 31/12* (2020.01)
*G01R 31/16* (2006.01)

(52) U.S. Cl.
CPC ......... *G01R 31/1263* (2013.01); *G01R 31/16* (2013.01)

(58) Field of Classification Search
CPC .............................. G01R 31/1263; G01R 31/16
See application file for complete search history.

(56) References Cited

U.S. PATENT DOCUMENTS

| | | | | |
|---|---|---|---|---|
| 4,956,604 A | * | 9/1990 | Cedrone | G01R 1/0433 324/754.07 |
| 5,502,397 A | * | 3/1996 | Buchanan | G01R 31/2863 324/756.04 |
| 6,069,480 A | * | 5/2000 | Sabounchi | G01R 1/0466 324/754.05 |
| 6,359,452 B1 | * | 3/2002 | Mozzetta | G01R 1/0408 324/750.25 |
| 2011/0309850 A1 | * | 12/2011 | Yoshida | G01R 31/129 324/750.14 |
| 2013/0021040 A1 | * | 1/2013 | Jin | H01R 11/24 324/538 |

* cited by examiner

*Primary Examiner* — Akm Zakaria
(74) *Attorney, Agent, or Firm* — John R. Pessetto; Charles A. Brill; Frank D. Cimino

(57) ABSTRACT

A handler for holding an electronic device during high voltage testing includes conductive lead guides for shorting leads on one side of the isolator together and connectors connecting the lead guides to conductors.

29 Claims, 2 Drawing Sheets

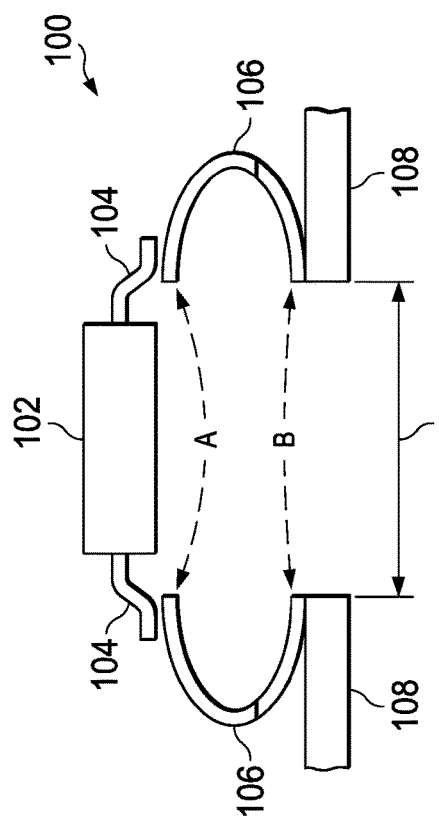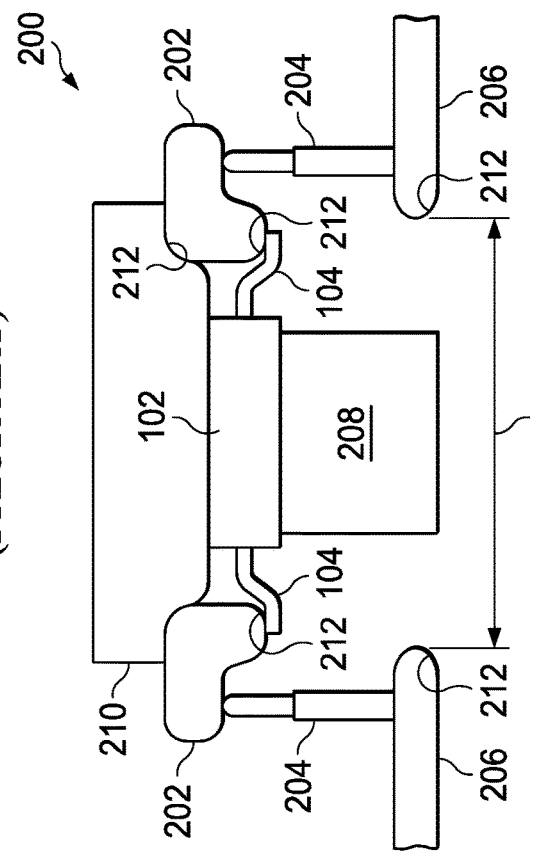
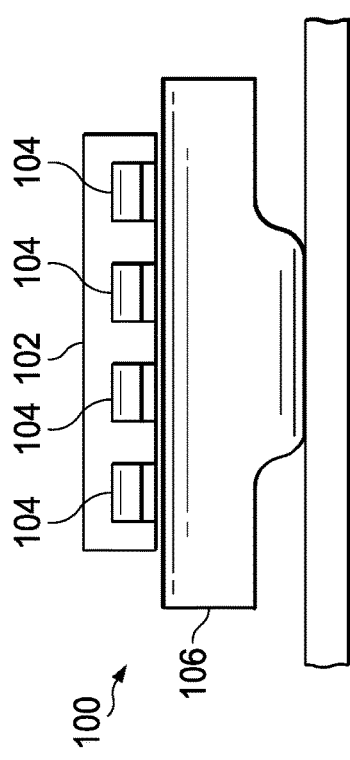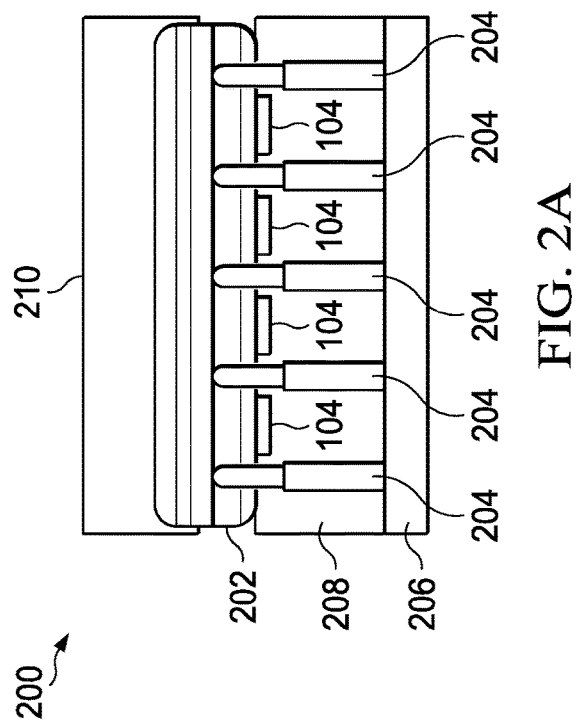
FIG. 1A (PRIOR ART)
FIG. 1B (PRIOR ART)
FIG. 2A
FIG. 2B

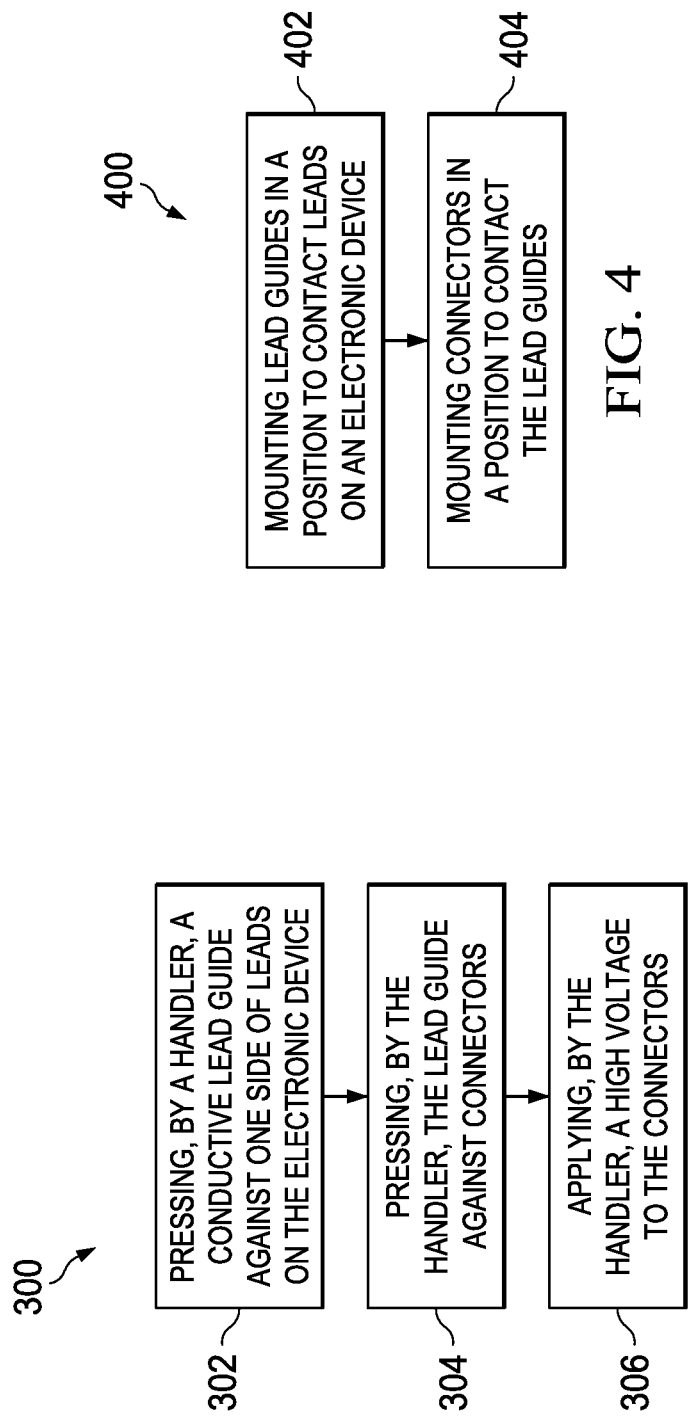

HIGH-VOLTAGE ISOLATOR TESTING

BACKGROUND

In many electrical and electronic systems, there is a need to isolate parts of a system to prevent unwanted currents between two parts of the system, or to prevent high voltage in a part of the system, while allowing signal and power transfer between parts. For example, there may be a need for high-voltage isolation to prevent electrical shock to humans, or a need for high-voltage isolation to prevent damage to sensitive components in high-voltage systems, or both.

There are commercially available components, called isolators, which are used to provide high-voltage isolation. One example is the TI ISO7842 isolator from Texas Instruments. There are multiple standards for isolators that provide parameter definitions and test methodologies. Example standards include IEC 60747-5, VDE 0884-10, and UL 1577. In the IEC, VDE, and UL standards, a voltage $V_{IOTM}$ is defined as the peak transient voltage that an isolator can handle without breaking down, and a voltage $V_{ISO}$ is defined as the RMS value of an AC voltage that an isolator can handle for 60 seconds without breaking down. For example, for systems operating at line voltages up to 1,000 Vrms, the IEC, VDE, and UL standards specify $V_{IOTM}$ at 6,222V and specify $V_{ISO}$ at 4,400V. There are commercially available testers for testing isolators to certify that the isolators comply with the IEC, VDE, and UL standards and comply with the manufacturer's published specifications. Examples include the HT-9464 high-voltage tester manufactured by Harris Tuvey (HT, LLC) and the ETS-88 Test System from Teradyne, Inc.

For testing, an isolator is placed into a handler (also called a test head). One tester may be connected to multiple handlers. The handlers are designed to contact leads on a specific isolator package geometry. For example, an isolator may have a rectangular package with leads along two sides. During testing, the handler ideally connects all leads on a first side of the isolator package together and all leads on a second side together, and the tester then supplies a test voltage through the handler across the two sides of the isolator. Conventional handlers are capable of testing isolators at 3,800V. However, as discussed above, new standards specify $V_{IOTM}$ at 6,222V and $V_{ISO}$ at 4,400V. In addition, the manufacturer's specification for $V_{IOTM}$ for the ISO7842 isolator is 8,000V and the manufacturer's specification for $V_{ISO}$ for the ISO7842 is 5,700V. For conventional handlers, test voltages of 8,000V sometimes result in arcing, which may damage the isolator being tested and may damage the handler. There is a need for an improved handler with reduced arcing at high voltages.

BRIEF DESCRIPTION OF THE DRAWINGS

FIG. 1A is a block diagram side view of part of an example prior art handler for applying high voltages to an isolator during high-voltage testing.

FIG. 1B is an end view of the handler of FIG. 1A.

FIG. 2A is a block diagram side view of part of an example embodiment of an improved handler for applying high voltages to an isolator during high-voltage testing.

FIG. 2B is an end view of the handler of FIG. 2A.

FIG. 3 is a flow chart of an example method of high-voltage testing an isolator.

FIG. 4 is a flow chart of an example method of fabricating a handler for applying high voltages to an isolator during high-voltage testing.

DETAILED DESCRIPTION

FIGS. 1A and 1B illustrate part of an example prior art handler 100 for applying high voltages to an isolator 102 during high-voltage testing. In FIGS. 1A and 1B, an isolator 102 has leads 104 on two sides. The handler 100 has two flexible metal contactors 106 bent such that when the isolator 102 is clamped into the handler 100 the contactors 106 are spring loaded against one side of the isolator leads 104. Ideally, each contactor 106 simultaneously contacts all the isolator leads 104 on one side of the isolator 102. The contactors 106 are attached to conductors 108 (which may be for example traces on a printed circuit board) and a tester (not shown) applies a voltage to contactors 106 through the conductors 108.

For the handler 100, if the isolator leads 104 are not substantially flat, then some isolator leads 104 may not make good contact with the contactors 106, which may result in arcing between a contactor 106 and one or more isolator leads 104. Alternatively, arcing may occur across an air gap between the contactors 106 at a path indicated by path "A" in FIG. 1B, or at a path indicated by path "B" in FIG. 1B. Arcing may also occur between the conductors 108. Conductors 108 are separated by a distance 110 and arcing may also occur between conductors 108.

FIGS. 2A and 2B illustrate an example embodiment of part of an improved handler 200. In FIGS. 2A and 2B, an isolator 102 has leads 104 on two sides. The handler 200 has rigid conductive (for example, copper or other metal) lead guides 202 that press against the tops of the leads 104. Each lead guide 202 contacts one surface of all the leads 104 on one side of the isolator 102, thereby shorting all the leads 104 on one side of the isolator 102 together. At least one connector 204 connects the lead guides 202 to conductors 206 (which may be, for example, traces on a printed circuit board). In the example of FIGS. 2A and 2B, the connectors 204 are rounded-tip spring-loaded test pins (also known as POGO pins). Connectors 204 are mounted in sets so that all the test pins 206 for one side of the isolator 102 are in a set. A plurality of the connectors 204 in a set are shorted together by one of the conductors 206. The number of connectors 204 shown in FIGS. 2A and 2B is for illustration only and the number may vary.

A tester (not shown) applies a high voltage to the conductors 206. The handler 210 includes an insulator 208 that helps prevent arcing between the connectors 204 and between the conductors 206 and an additional insulator 210 that helps prevent arcing between the lead guides 202. The insulators 208 and 210 are preferably made of a material (for example, plastic) having a high dielectric strength (for example polytetrafluoroethylene, polycarbonate, polyethylene, polyethyleneterephthalate, polyimide, polypropylene, etc.)

If a charged body has an area with high curvature, such as a sharp corner or a sharp point, the electric field strength around the high curvature area will be much higher than other areas. Air near the high curvature area can become ionized, and the ionization may spread, ultimately resulting in an electric arc. In the example handler of FIGS. 1A and 1B, arcing may occur at the sharp edges of the contactor 106 (paths "A" and "B") and at the corners of the conductors 108. In the embodiment of FIGS. 2A and 2B, the sharp edges of the contactor 106 are eliminated, and the curvature of the corners 212 of the lead guides 202 and the conductors 206 has been decreased (that is, the corners on facing surfaces are more rounded and less sharp). In addition, the spacing 214 between conductors 206 in the embodiment of FIGS. 2A and 2B is greater than the spacing 110 between conductors 108 in the embodiment of FIGS. 1A and 1B. In particular, the spacing 214 between conductors 206 is greater than the spacing between sets of leads 104 on opposite sides of the isolator 102.

The handler illustrated in FIGS. 2A and 2B provides multiple improvements over conventional handlers to prevent arcing, as follows:

1. Pressing the rigid lead guides 202 against the leads 104 provides straightening of the leads 104, thereby improving shorting of the leads 104 together.
2. The insulator 208 helps prevent arcing at both paths "A" and "B" illustrated in FIG. 1B.
3. Use of spring-loaded pins for the connectors 204 ensures a good multi-point contact with the lead guides 202, preventing any arcing between the lead guides 202 and the connectors 204.
4. Connecting to the lead guides 202 with connectors 204 enables the spacing 214 between conductors 206 (FIG. 2B) to be greater than the spacing 110 between conductors 108 (FIG. 1B), helping to prevent arcing between conductors.
5. Corners on conductive surfaces have been rounded (for example, corners 212), thereby reducing the risk of arcing at areas having a high curvature (that is, areas having a low radius or sharp corners).

An implementation of a handler as illustrated in FIGS. 2A and 2B has been successfully tested at 8,400V with no arcing.

FIG. 3 is a flow chart of an example method 300 of high voltage testing for an isolator. At step 302, a conductive lead guide is pressed against one side of leads on the isolator. At step 304, the conductive lead guide is pressed against connectors. At step 306, a high voltage is applied to the connectors.

FIG. 4 is a flow chart of an example method 400 of fabricating a handler for holding an isolator during high voltage testing. At step 402, lead guides are mounted in a position to contact leads on the isolator. At step 404, connectors are mounted in a position to contact the lead guides.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A handler for holding an electronic device during high voltage testing, the handler comprising:
    conductive lead guides, each lead guide having a single conductive surface for shorting all leads on one side of an electronic device under test; and
    a plurality of connectors connecting the lead guides to conductors.
2. The handler of claim 1, further comprising:
    an insulator, located between the lead guides.
3. The handler of claim 2, where the insulator is made of plastic.
4. The handler of claim 1, where the connectors are spring-loaded test pins.
5. The handler of claim 1, where high voltage is coupled from the conductors through the connectors to the lead guides.
6. The handler of claim 1, where the connectors are arranged into sets, each set contacting one lead guide.
7. The handler of claim 6, further comprising:
    an insulator, located between sets of the connectors.
8. The handler of claim 7, where the insulator is made of plastic.
9. The handler of claim 6, where each set of connectors is mounted onto a conductor.
10. The handler of claim 9, where corners of the conductors are rounded.
11. The handler of claim 1, where the lead guides are made of metal.
12. The handler of claim 11, where the lead guides are made of copper.
13. The handler of claim 1 where corners of the lead guides are rounded.
14. A method of high-voltage testing an electronic device, comprising:
    pressing, by a handler, a conductive lead guide having a single conductive surface against all leads on one side of the electronic device;
    pressing, by the handler, the lead guide against connectors; and
    applying, by the handler, a high voltage to the connectors.
15. The method of claim 14, further comprising:
    locating, by the handler, an insulator between the lead guides and above the electronic device under test.
16. The method of claim 14, further comprising:
    locating, by the handler, an insulator at a midpoint between sets of the connectors.
17. A method of fabricating a handler for holding an electronic device during high voltage testing, comprising:
    mounting lead guides in a position to facilitate each lead guide contacting all leads on one side of an electronic device under test with a single conductive surface of the lead guide; and
    mounting connectors in a position to contact the lead guides.
18. The method of claim 17, further comprising:
    mounting an insulator so that it is located between the lead guides and above the electronic device under test.
19. The method of claim 17, further comprising:
    mounting an insulator so that it is located at a midpoint between sets of the connectors.
20. The handler of claim 1, wherein the conductive lead guides are rigid.
21. The handler of claim 1, wherein the electronic device under test is an isolator.
22. The handler of claim 1, wherein each conductive lead guides presses down against a top surface of all leads on one side of the electronic device under test.
23. The method of claim 17, wherein the conductive lead guides are rigid.
24. The method of claim 17, wherein the electronic device under test is an isolator.
25. The method of claim 17, wherein each conductive lead guides presses down against a top surface of all leads on one side of the electronic device under test.
26. A handler for holding an electronic device during high voltage testing, the handler comprising:
    conductive lead guides, each lead guide for pressing down against and shorting all leads on one side of an electronic device under test; and
    a plurality of connectors connecting the lead guides to conductors.
27. The method of claim 14, wherein the conductive lead guides are rigid.

28. The method of claim 14, wherein the electronic device under test is an isolator.

29. The method of claim 14, wherein each conductive lead guides presses down against a top surface of all leads on one side of the electronic device under test.

\* \* \* \* \*